(12) United States Patent
Suh et al.

(10) Patent No.: US 7,671,359 B2
(45) Date of Patent: Mar. 2, 2010

(54) THIN FILM TRANSISTOR, A METHOD FOR PREPARING THE SAME AND A FLAT PANEL DISPLAY EMPLOYING THE SAME

(75) Inventors: Min-Chul Suh, Suwon-si (KR);
Myeong-Seob So, Suwon-si (KR);
Jae-Bon Koo, Suwon-si (KR);
Nam-Choul Yang, Suwon-si (KR)

(73) Assignee: Samsung Mobile Display Co., Ltd., Suwon-Si, Gyeonggi-Do (KR)

( * ) Notice: Subject to any disclaimer, the term of this patent is extended or adjusted under 35 U.S.C. 154(b) by 744 days.

(21) Appl. No.: 11/329,865

(22) Filed: Jan. 9, 2006

(65) Prior Publication Data

US 2006/0160280 A1 Jul. 20, 2006

(30) Foreign Application Priority Data

Jan. 15, 2005 (KR) .................... 10-2005-0003976

(51) Int. Cl.
*H01L 51/00* (2006.01)
*H01L 51/40* (2006.01)

(52) U.S. Cl. .................. 257/40; 257/66; 257/E51.006; 438/99; 438/158; 438/161

(58) Field of Classification Search ........... 257/E51.006
See application file for complete search history.

(56) References Cited

U.S. PATENT DOCUMENTS

| 7,208,756 B2* | 4/2007 | Shih et al. ...................... 257/40 |
| 7,332,369 B2* | 2/2008 | Veres et al. .................... 438/99 |
| 2003/0102471 A1* | 6/2003 | Kelley et al. .................. 257/40 |
| 2005/0211976 A1* | 9/2005 | Redecker et al. .............. 257/40 |
| 2005/0242342 A1 | 11/2005 | Suh et al. |
| 2006/0049395 A1 | 3/2006 | Nobuo |

(Continued)

FOREIGN PATENT DOCUMENTS

EP  1 398 840 A3  6/2006

(Continued)

OTHER PUBLICATIONS

Office Action issued by Japanese Patent Office on Jul. 21, 2009 in 2 pgs.

*Primary Examiner*—Stephen W Smoot
(74) *Attorney, Agent, or Firm*—Knobbe Martens Olson & Bear LLP (57) ABSTRACT

Provided are a thin film transistor, a method for preparing the same and a flat panel display employing the same. The thin film transistor includes a gate electrode, source and drain electrodes insulated from the gate electrode, a semiconductor layer insulated from the gate electrode and electrically connected to the source and drain electrodes, an insulating layer, and a carrier blocking layer interposed between the semiconductor layer and the insulating layer and preventing electrons or holes moving through semiconductor layer from being trapped in the insulating layer. Since the thin film transistor is constructed such that the carrier blocking layer is interposed between the semiconductor layer and the insulating layer, the electrons or holes injected into the semiconductor layer can be prevented from being trapped in the insulating layer, thereby suppressing hysteresis characteristic. In addition, a reliable flat panel display device can be manufactured using the thin film transistor.

14 Claims, 4 Drawing Sheets

U.S. PATENT DOCUMENTS

2006/0108581 A1* 5/2006 Ahn et al. .................... 257/40
2006/0138405 A1* 6/2006 Yang et al. .................... 257/40

FOREIGN PATENT DOCUMENTS

| JP | 2004-103905 | 2/2004 |
| WO | 03054970 A1 | 7/2003 |
| WO | WO 2004/114414 A1 | 12/2004 |

* cited by examiner

FIG. 6

THIN FILM TRANSISTOR, A METHOD FOR PREPARING THE SAME AND A FLAT PANEL DISPLAY EMPLOYING THE SAME

CROSS-REFERENCE TO RELATED APPLICATIONS

This application claims the benefit of Korean Patent Application No. 10-2005-0003976, filed on Jan. 15, 2005, in the Korean Intellectual Property Office, the disclosure of which is incorporated herein in its entirety by reference.

BACKGROUND OF THE INVENTION

1. Field of the Invention

The present embodiments relate to a thin film transistor, a method for preparing the same and a flat panel display employing the same, and more particularly, to a this film transistor having improved charge mobility by overcoming a hysteresis characteristic problem, a method for preparing the same and a flat panel display employing the thin film transistor.

2. Description of the Related Art

A thin film transistor (TFT) used in a flat panel display device such as, for example, a liquid crystal display device, an organic light-emitting device, or an inorganic light-emitting device, is used as a switching element for controlling the operation of each pixel and a driving element for driving the pixel.

Such a TFT includes a semiconductor layer having source region and a drain region, and a channel region formed between the source/drain regions, a gate electrode insulated from the semiconductor layer and positioned on a region corresponding to the channel region, and source/drain electrodes contacting the source/drain regions, respectively.

Since the source/drain electrodes are generally made of a metal having a low work function for facilitating the flow of charges, contact resistance increases at a region where the metal and the semiconductor layer contact each other, resulting in a deterioration of device characteristics and increasing power consumption.

Recently, research into an organic thin film transistor has been actively conducted because it is advantageous in that it comprises an organic semiconductor layer. Since the organic semiconductor layer can be formed at a low temperature, use of a plastic substrate has become possible.

To improve electrical performance of the organic thin film transistor, e.g., a driving voltage, a thin film transistor comprising a buffer layer between a source/drain electrode and an organic semiconductor layer or a self-assembly monolayer between a gate insulating layer and an organic semiconductor layer has been proposed, as described in Japanese Patent Laid-open Publication No. 2004-103905.

However, known organic thin film transistors have not hitherto been suited to actual applications due to hysteresis characteristics. Accordingly, it would be highly desirable to develop thin film transistors having satisfactory operational stability.

SUMMARY OF THE INVENTION

The present embodiments provide a thin film transistor having improved charge mobility by overcoming a hysteresis characteristic problem, a method for preparing the same and a flat panel display employing the thin film transistor.

According to an aspect of the present embodiments, there is provided a thin film transistor including a gate electrode, source and drain electrodes insulated from the gate electrode, a semiconductor layer insulated from the gate electrode and electrically connected to the source and drain electrodes, an insulating layer for insulating the gate electrode from the source and drain electrodes or the semiconductor layer, and a carrier blocking layer interposed between the semiconductor layer and the insulating layer and preventing electrons or holes from moving through the semiconductor layer from being trapped into the insulating layer.

According to another aspect of the present embodiments, there is provided a method for preparing a thin film transistor including forming a gate insulating layer to cover a gate electrode provided on a substrate, forming source/drain electrodes at predetermined locations corresponding to opposite ends of the gate electrode on the insulating layer, forming a carrier blocking layer on a predetermined region on the insulating layer so that the insulating layer contacts a semiconductor layer through the carrier blocking layer, and forming the semiconductor layer on the resultant product.

According to still another aspect of the present embodiments, there is provided a method for preparing a thin film transistor including forming a gate insulating layer to cover a gate electrode provided on a substrate, forming source/drain electrodes at predetermined locations corresponding to opposite ends of the gate electrode on the insulating layer, forming a carrier blocking layer on a predetermined region on the insulating layer so that the insulating layer contacts a semiconductor layer through the carrier blocking layer, forming an organic acceptor layer to cover the source and drain electrodes in the resultant product, and forming the semiconductor layer on the resultant product.

According to yet another aspect of the present embodiments, there is provided a method for preparing a thin film transistor including forming a semiconductor layer over source and drain electrodes provided on a substrate, forming a carrier blocking layer on a predetermined region on the semiconductor layer, the predetermined region corresponding to the source and drain electrodes, so that the semiconductor layer contacts an insulating layer through the carrier blocking layer, and forming the insulating layer to cover the semiconductor layer and the carrier blocking layer, and forming a gate electrode on a predetermined region on the insulating layer, the predetermined region corresponding to the source and drain electrodes.

According to yet a further aspect of the present embodiments, there is provided a flat panel display device comprising the thin film transistor wherein the thin film transistor is provided in each pixel, and a pixel electrode is electrically connected to a source or drain electrode of the thin film transistor.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

The present embodiments will now be described in more detail.

Operational stability of an organic thin film transistor is determined by hysteresis characteristics, which account for instable operation of the organic thin film transistor.

Based on the examination of hysteresis characteristics exhibited in the organic thin film transistor, it is thought that the hysteresis characteristics are caused by mobile charges and trapping charges. Accordingly, the inventors of the present embodiments evaluated capacitance versus voltage CV characteristics of organic thin film transistors, confirming that one of major causes of the hysteresis characteristics was hole charges migrating from an organic semiconductor layer, particularly an organic semiconductor layer made of pentacene, and injected into a gate insulating layer to be trapped in an oxide forming the gate insulating layer.

To prevent the hysteresis characteristics, the present embodiments provide a thin film transistor comprising a carrier blocking layer between an insulating layer and a semiconductor layer, the carrier blocking layer serving as an energy barrier for preventing carriers from being injected into the gate insulating layer from the semiconductor layer.

The carrier blocking layer may be an electron blocking layer or a hole blocking layer.

In order to increase the quantity of holes injected into the semiconductor layer, the film transistor according to the present embodiments may further include an organic acceptor layer between the semiconductor layer and the source/drain electrode in addition to the hole blocking layer.

In the present embodiments, the semiconductor layer is preferably an organic semiconductor layer.

In the following description, the present embodiments will be described by taking an example of a hole blocking layer as the carrier blocking layer. However, the operation of the electron blocking layer is substantially the same as that of the hole blocking layer except the electron blocking layer is formed to block electrons rather than holes.

Specific examples of the thin film transistor according to present embodiments will now be described in more detail with reference to FIGS. 1 through 3.

Figure 1:
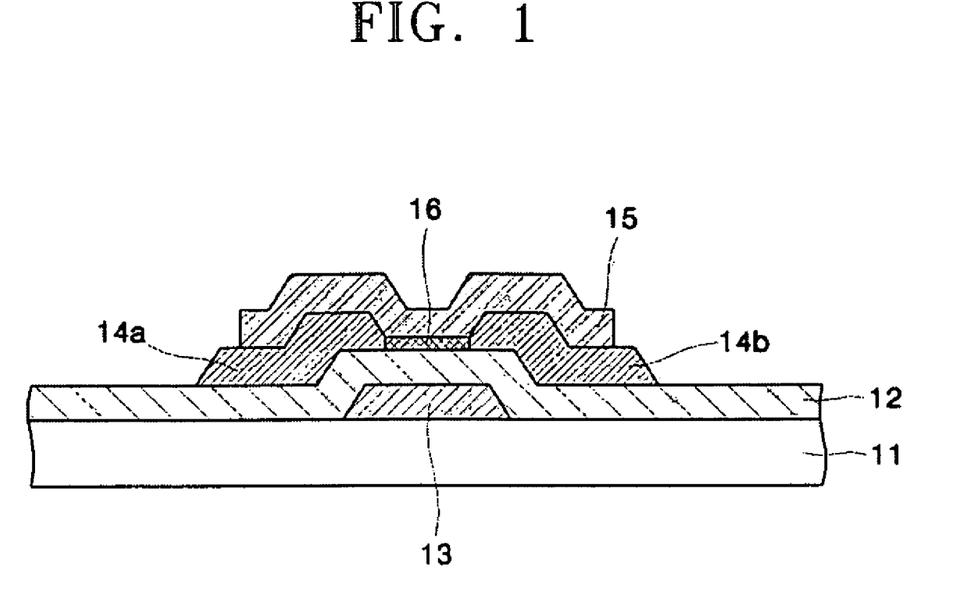
FIGS. 1 through 3 are cross-sectional views illustrating thin film transistors according to some embodiments.

FIG. 1 illustrates a thin film transistor according to a preferred embodiment.

In FIG. 1, a substrate 11 is a common substrate that is widely used in the general organic electroluminescent device. The substrate 11 may be, for example, an organic substrate or a transparent plastic substrate.

A gate electrode 13 having a predetermined pattern is formed on the substrate 11. The gate electrode 13 may be formed of a metal or metal alloy, such as, for example, Au, Ag, Cu, Ni, Pt, Pd, Al, Mo, Al:Nd alloy, or Mo:W alloy, but not limited thereto. A conductive polymer may also be used for forming the gate electrode 13. An insulating layer 12 is formed on the gate electrode 13 to cover the gate electrode 13.

The insulating layer 12 can be formed of various materials, including, for example, an organic material such as metal oxide or metal nitride, and an organic material such as an insulating organic polymer which can be, for example, poly(vinyl phenol), poly(vinyl pyridine), polystyrene, BCB(benzocyclobutene), poly(methyl methacrylate), poly(vinyl alcohol), poly(vinyl phenol) containing crosslinkable melamine resin, poly(vinyl alcohol) containing a photoacid generator, poly(vinyl naphthalene), poly(acenaphtylene) and any of the aforementioned polymers containing crossslinkable functional materials such as bis(trichlorosilane alkane), bis(trialkoxy alkane), etc.

Source and drain electrodes 14a and 14b are formed on the insulating layer 12. As shown in FIG. 1, the source and drain electrodes 14a and 14b may, but not necessarily, overlap with the gate electrode 13 by a predetermined portion. The source and drain electrodes 14a and 14b are generally formed of noble metals having a work function of about 5.0 eV or greater in relation to a material forming the organic semiconductor layer. Non-limiting examples of the useful noble metals include Au, Pd, Pt, Ni, Rh, Ru, Ir, Os, and alloys thereof, preferably Au, Pd, Pt, or Ni.

An organic semiconductor layer 15 is formed over either the entire surface of the source and drain electrodes 14a and 14b or part of the surface of the source and drain electrodes 14a and 14b. An organic semiconductor material forming the organic semiconductor layer 15 may be a p-type semiconductor material. Of course, an n-type semiconductor material may also be used as the organic semiconductor material forming the organic semiconductor layer 15.

Examples of the semiconductor layer include, but are not limited to the organic acceptor layer which includes but is not limited to pentacene, tetracene, anthracene, naphthalene, alpha-6-thiophene, alpha-4-thiophene, perylene and derivatives thereof, rubrene and derivatives thereof, coronene and derivatives thereof, perylene tetracarboxylic diimide and derivatives thereof, perylenetetracarboxylic dianhydride and derivatives thereof, polythiopene and derivatives thereof, polyparaphenylenevinylene and derivatives thereof, polyparaphenylene and derivatives thereof, polyfluorene and derivatives thereof, polythiophene vinylene and derivatives thereof, thiophene-heterocyclic aromatic copolymer and derivatives thereof, oligonaphthalene and derivatives thereof, oligothiopenes of alpha-5-thiophene and derivatives thereof, metal-containing phthalocyanine and derivatives thereof, metal-free phthalocyanine and derivatives thereof, pyromellitic dianhydride and derivatives thereof, and pyromellitic diimide and derivatives thereof. In the above examples, "aromatic copolymer" in the term "thiophene-heterocyclic aromatic copolymer" includes, for example, oxadiazole and benzo-fused analogs thereof, thiadiazole and benzo-fused analogs thereof, pyridine and benzo-fused analogs thereof, pyrimidine and benzo-fused analogs thereof. Examples of a benzo-fused analog include quinoline.

As shown in FIG. 1, a hole blocking layer 16 is provided between the insulating layer 12 and the organic semiconductor layer 15, the insulating layer 12 and the organic semiconductor layer 15 contact each other through the hole blocking layer 16. The hole blocking layer 16 serves as an energy barrier for preventing holes from being injected into the insulating layer from the organic semiconductor layer and being trapped in an oxide forming the insulating layer.

Any material that has hole blocking capability can be used as the hole blocking layer 16, preferably an organic semiconductor having a HOMO (Highest Occupied Molecular Orbital) level greater than that of an organic semiconductor forming the semiconductor layer, more preferably an organic semiconductor having a HOMO level that is at least about 0.5 eV greater than that of an organic semiconductor forming the semiconductor layer, most preferably an organic semiconductor having a HOMO level that is from about 0.5 to about 1 eV greater than that of an organic semiconductor forming the semiconductor layer.

In a case where the hole blocking layer is made of a material having a HOMO level that is at least about 0.5 eV greater than that of the organic semiconductor forming the semiconductor, the operation of the present embodiments will now be described with reference to FIG. 4.

Figure 4:
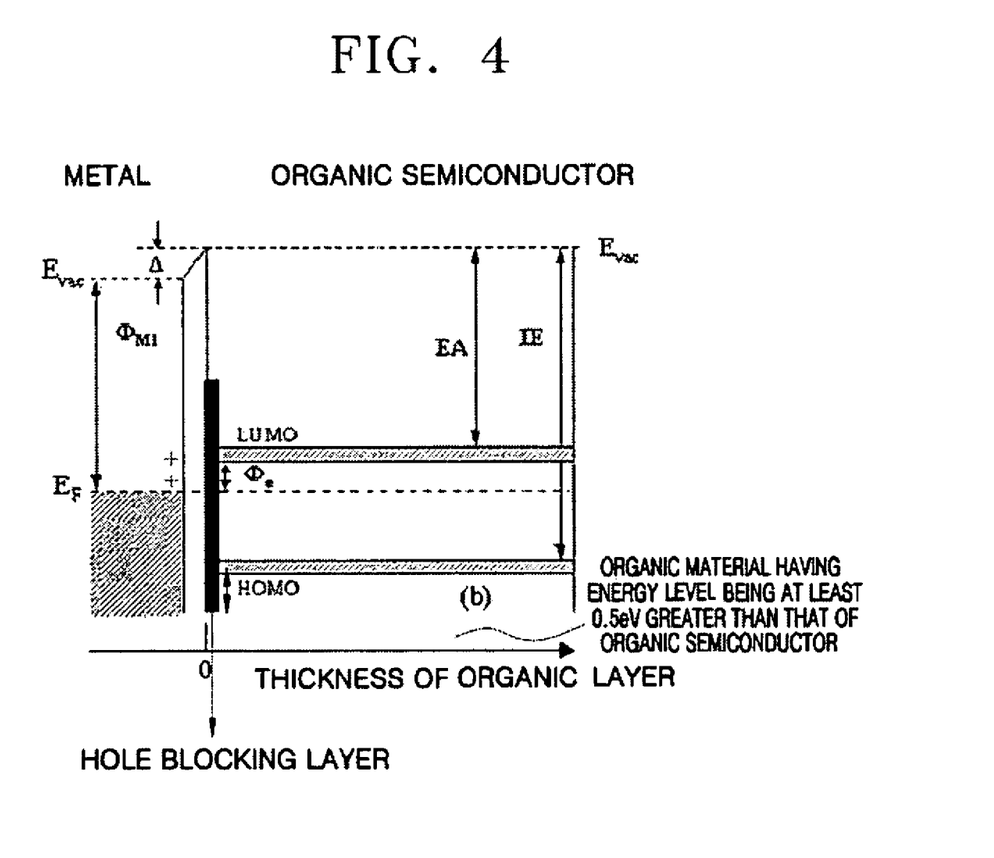
FIGS. 4 and 5 illustrate energy characteristics of materials for forming a hole blocking layer according to the present embodiments.

Referring to FIG. 4, an organic material having about 0.5 eV greater than an energy level of an organic semiconductor is blocked, thereby preventing the carriers from being trapped in the gate insulating layer.

Figure 5:
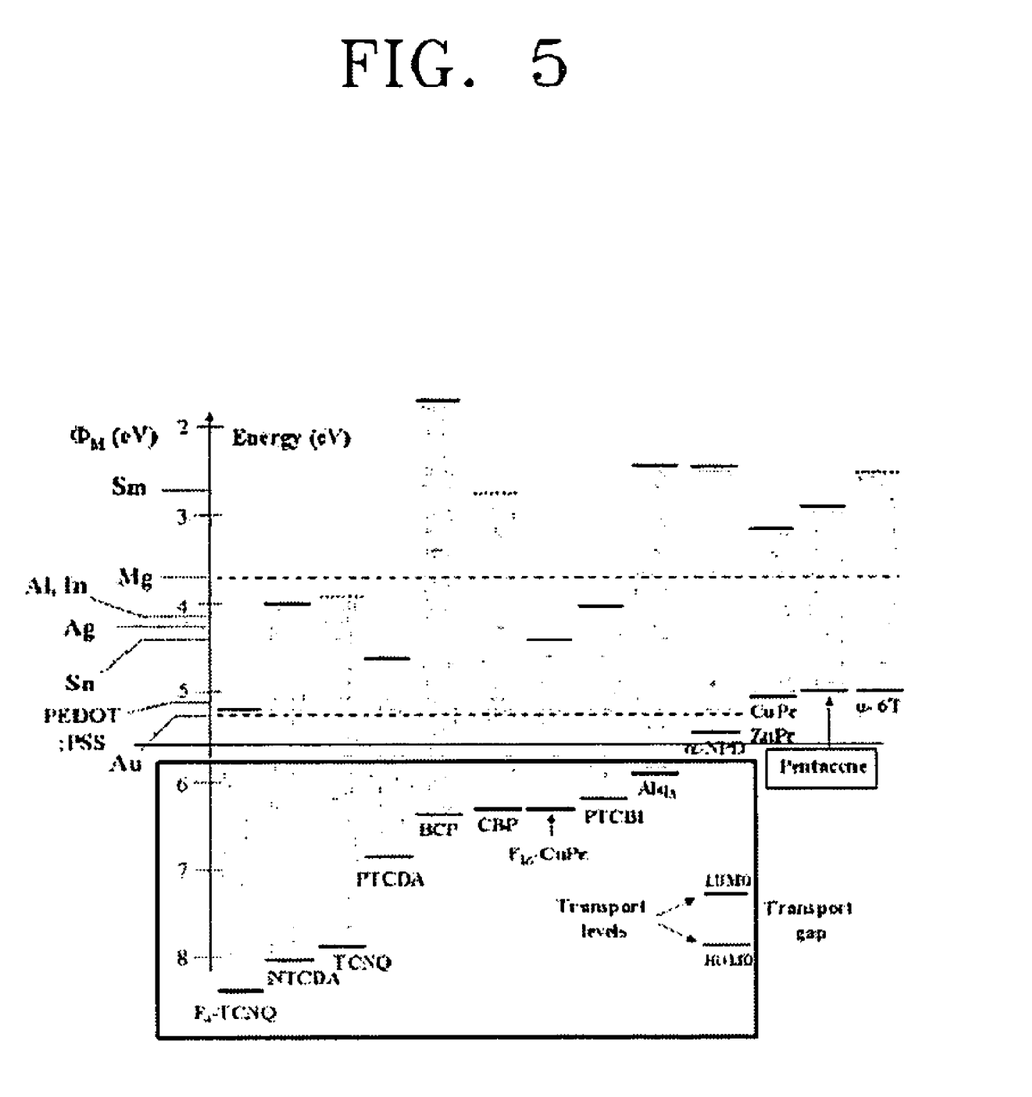

In a case where the organic semiconductor layer includes pentacene, the hole blocking layer may include a material having the (HOMO) level that is at least about 0.5 eV greater than that of pentacene, as shown in FIG. 5. Examples of such hole blocking layers include Alq3 (tris(8-hydroxyquinoline) aluminum), F4-TCNQ (2,3,5,6-Tetrafluoro-7,7,8,8-tetracyano-p-quinodimethane NTCDA (1,4,5,8-naphthalene-tetracarboxylic acid dianhydride), PTCDA (3,4,9,10-perylenetetracarboxylic dianhydride), BCP (bathocuproine), CBP (4,4'-N,N'-dicarbazolyl-biphenyl), copper phthalocyanine(CuPc), and PTCBI (3,4,9,10-peryleneetracarboxylic bisbenzimidazole).

Figure 2:
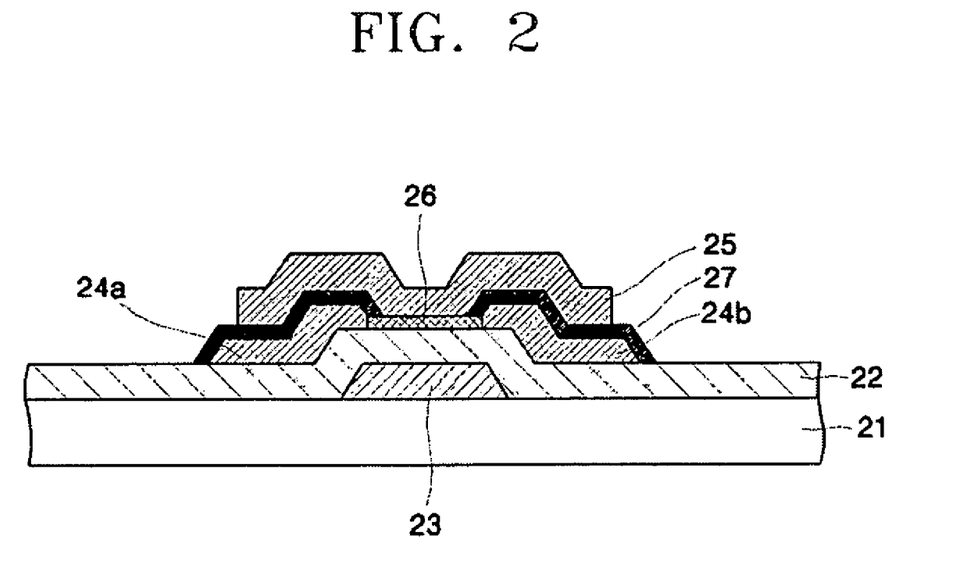

FIG. 2 illustrates another example of the thin film transistor according to the present embodiments.

Referring to FIG. 2, a gate electrode 23 having a predetermined pattern is provided on a substrate 21, and an insulating layer 22 is formed on the gate electrode 23 to cover the gate electrode 23. Source and drain electrodes 24a and 24b are formed on predetermined locations of the insulating layer 22, the predetermined locations corresponding to the gate electrode 23, and an organic semiconductor layer 25 is formed thereon.

A hole blocking layer 26 is formed between the insulating layer 22 and the organic semiconductor layer 25. An organic acceptor layer 27 is provided between the source and drain electrodes 24a and 24b and the organic semiconductor layer 25. Here, the organic acceptor layer 27 serves to increase the amount of holes injected into the organic semiconductor layer 25.

That is, the organic acceptor layer 27, which is disposed between the source and drain electrodes 24a and 24b and the organic semiconductor layer 25, reduces a contact resistance between the source and drain electrodes 24a and 24b and the organic semiconductor layer 25 and improves charge mobility therebetween.

Examples of materials for forming the organic acceptor layer include aromatic compounds containing at least one electron withdrawing group selected from the group consisting of —$NO_2$, —CN, —C(=O)—, —COO—, —C(=O)—O—C(=O)—, —CONH—, —SO—, —$SO_2$—, —C(=O)—C(=O)—, =N—, —F, —Cl, —I, $C_{1-10}$ haloalkyl group, and $C_{5-10}$ haloaryl group.

The $C_{1-10}$ haloalkyl group refers to an alkyl group having 1-10 carbon atoms substituted with one or more halogens. Examples of alkyl include, but are not limited to, methyl, ethyl, n-propyl, i-propyl, butyl, pentyl, and hexyl. $C_{1-5}$ haloalkyl is preferred.

The $C_{5-10}$ haloaryl group refers to an aryl group having 5-10 carbon atoms, substituted with one or more halogens. The aryl group means a radical derived from an aromatic ring system, and examples thereof include, but are not limited to, phenyl and naphthyl.

The term "aromatic compound" as used herein embraces both aromatic carbocyclic compounds and aromatic heterocyclic compounds. Examples of the aromatic compound include at least one of the above electron-withdrawing groups, one or more groups selected from 5-membered to 7-membered carbocyclic rings and heterocyclic rings, the carbocyclic rings and heterocyclic rings being fused together, or bonded with a single bond or ethylene groups. Here, the heterocyclic rings refer to carbocyclic rings having one or more carbon atoms substituted with one or more hetero atoms selected from the group consisting of N, S, P and O.

In the aromatic compound including at least one of the above-described electron-withdrawing groups, the electron-withdrawing groups may substitute one or more hydrogen atoms in the aromatic compound, or C, N, S, P or O in the rings of the aromatic compound. In addition, the hetero atoms in the heterocyclic rings of the aromatic compound may serve as the electron-withdrawing groups.

Examples of the aromatic compound containing the electron-withdrawing group include fluorenone-based compounds, aniline-based compounds, benzene-based compounds, naphthalene -based compounds, biphenyl-based compounds, stilbene-based compounds, anthracene-based compounds, dianhydride-based compounds, anhydride-based compounds, imide-based compounds, phenazine-based compounds, quinoxaline-based compounds, including at least one selected from the above-mentioned electron-withdrawing groups.

Non-limiting examples of the compound having the electron-withdrawing group include 2,4,7-trinitrofluorenone, 4-nitroaniline, 2,4-dinitroaniline, 5-nitroanthranilonitrile, 2,4-dinitrodiphenylamine, 1,5-dinitronaphthalene, 4-nitrobiphenyl, 4-dimethylamino-4'-nitrostilbene, 1,4-dicyanobenzene, 9,10-dicyanoanthracene, 1,2,4,5-tetracyanobenzene, 3,5-dinitrobenzonitrile, 3,4,9,10-perylenetetracarboxylic dianhydride, N,N'-bis(di-t-butylphenyl)-3,4,9,10-perylene dicarboxyimide, tetrachlorophthalic anhydride, tetrachlorophthalonitrile, tetrafluoro-1,4-benzoquinone, naphthoquinone, anthraquinone, phenanthrenequinone, 1,10-phenanthroline-5,6-dione, phenazine, quinoxaline and 2,3,6,7-tetrachloroquinoxaline.

Figure 3:
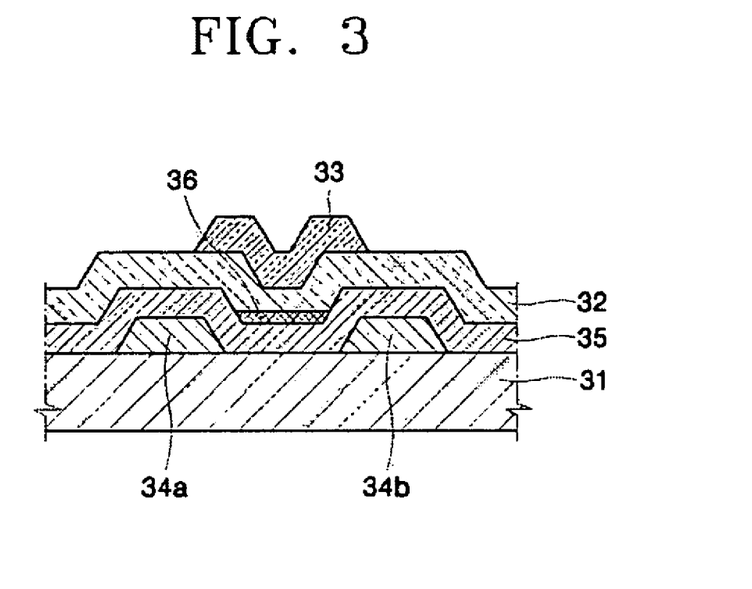

FIG. 3 illustrates another example of the thin film transistor according to the present embodiments.

Referring to FIG. 3, source and drain electrodes 34a and 34b having predetermined patterns are provided on a substrate 31 and organic semiconductor layer 35 is formed on the source and drain electrodes 34a and 34b.

An insulating layer 32 is formed over the organic semiconductor layer 35 to cover the organic semiconductor layer 35. A hole blocking layer 36 is formed in a contact region of the organic semiconductor layer 35 and the insulating layer 32, thereby effectively blocking holes from migrating from the organic semiconductor layer 35 to be trapped into the insulating layer 32.

A gate electrode 33 is formed over the insulating layer 32 to correspond to the source and drain electrodes 34a and 34b.

While the thin film transistor according to the present embodiments has been described with reference to FIG. 1 through 3, in which thin film transistor configurations according to specific embodiments provided for illustration only, are shown, a variety of stacked TFT configurations may be implemented.

Methods for forming a carrier blocking layer such as a hole blocking layer are not particularly limited, and examples thereof include evaporation, ink-jet printing, vapor jet, coating, laser ablation technique (LAT) and laser induced thermal imaging (LITI), and the like.

A method for preparing the thin film transistor shown in FIG. 1 will now be described.

First, an insulating layer 12 is formed on the substrate 11 to cover the gate electrode 13. Then, the source and drain electrodes 14a and 14b are formed at a predetermined location of the insulating layer 12.

Thereafter, the hole blocking layer 16 is formed only on a predetermined region over the insulating layer 12. The organic semiconductor layer 15 is formed on the resultant product.

The respective layers of the thin film transistor can be formed by various techniques, including evaporation, coating, and the like, and can vary according to layer forming materials used.

For example, the hole blocking layer 16 may be formed by vacuum deposition.

Hereinafter, a method for preparing the thin film transistor shown in FIG. 2 will be described.

First, the insulating layer 22 is formed on the substrate 21 to cover the gate electrode 23. Subsequently, the source and drain electrodes 24a and 24b are formed on predetermined locations of the insulating layer 22, the predetermined locations corresponding to the gate electrode 23 and the hole blocking layer 26 is then formed insulating layer 23 only on a predetermined region over the insulating layer 22.

Thereafter, the organic acceptor layer 27 is provided on the resultant product to cover the source and drain electrodes 24a and 24b.

Subsequently, the organic semiconductor layer 25 is formed over the resultant product, thereby completing the organic thin film transistor according to the present embodiments.

A method for preparing the thin film transistor shown in FIG. 3 will now be described.

First, the source and drain electrodes 34a and 34b are formed on the substrate 31. Then, the organic semiconductor layer is formed on the source and drain electrodes 34a and 34b provided on the substrate 31.

An insulating layer 32 is formed over the organic semiconductor layer 35 to cover the organic semiconductor layer 35. A hole blocking layer 36 is formed at a predetermined location on the organic semiconductor layer 35 so that the organic semiconductor layer 35 and the insulating layer 32 are contacted with each other through the hole blocking layer 36, the predetermined location corresponding to the source and drain electrodes 34a and 34b. Next, the insulating layer 32 is formed to cover the organic semiconductor layer 35 and the hole blocking layer 36, and the gate electrode 33 is then formed over the insulating layer 32 to correspond to the source and drain electrodes 34a and 34b, thereby completing the thin film transistor according to the present embodiments.

Of course, various changes or variations of the above-described preparation methods of the thin film transistor can be made in accordance with structures of thin film transistors intended to be formed.

The aforementioned thin film transistors can be applied to flat panel display devices such as LCDs or organic light-emitting devices, etc.

Figure 6:
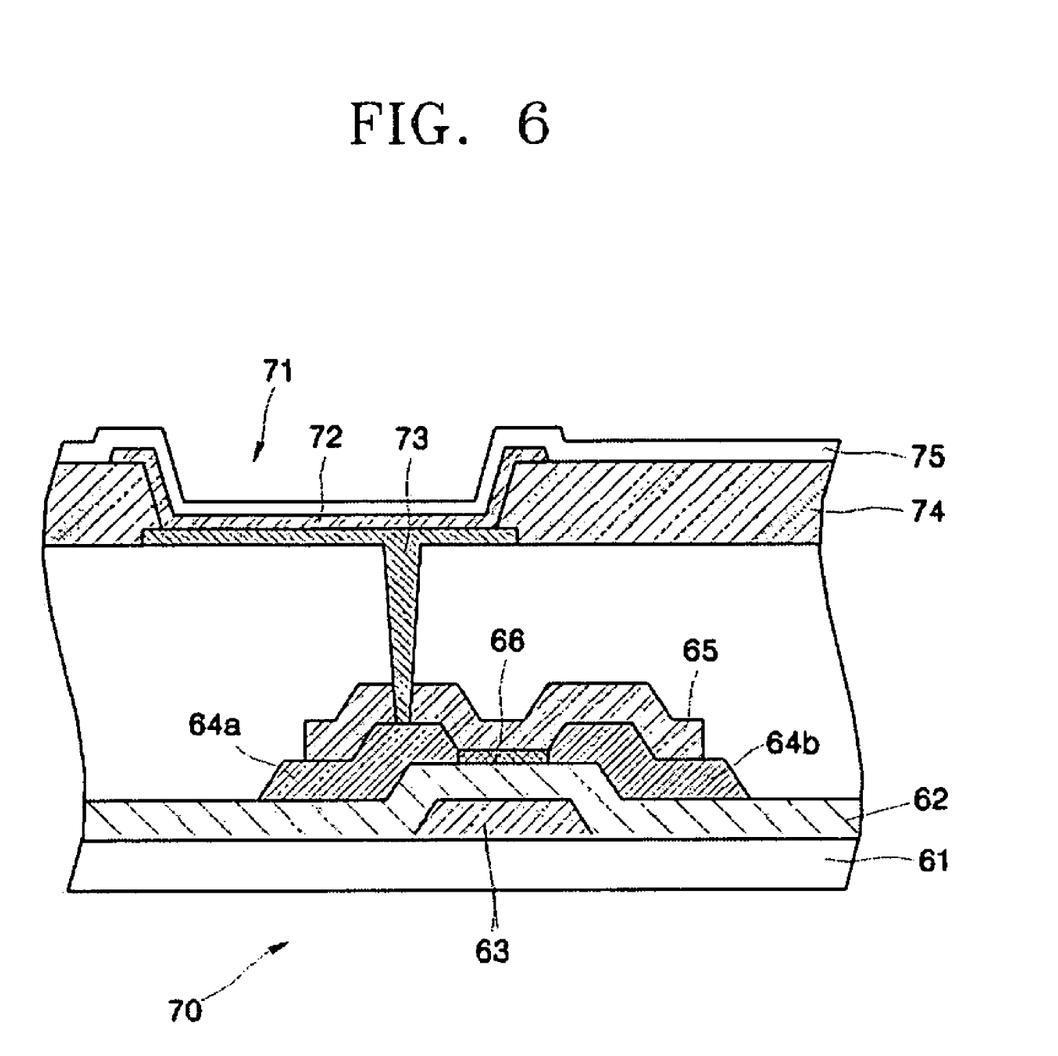
FIG. 6 is a cross-sectional view of a flat panel display device employing the thin film transistor according to the present embodiments.

FIG. 6 is a cross-sectional view of a flat panel display device implemented as an organic light-emitting device employing the thin film transistor according to the present embodiments.

FIG. 6 shows a unitary sub-pixel of an organic light-emitting device. An organic electroluminescent device (abbreviated as "EL device" hereinbelow), which is a self-emissive device, is provided in each sub-pixel and one or more thin film transistors are provided in the EL device. The organic light-emitting device can have a variety of pixel patterns according to colors emitted from the EL device, preferably red, green and blue pixels.

Referring to FIG. 6, a gate electrode 63 having a predetermined pattern is formed on a substrate 61 and an insulating layer 62 is formed to cover the gate electrode 63. Then, source and drain electrodes 64a and 64b are formed on the insulating layer 62 and the organic semiconductor layer 65 are formed on the source and drain electrodes 64a and 64b. A hole blocking layer 66 is formed at a predetermined region on the insulating layer 62.

A protective layer and/or a planarizing layer cover(s) the thin film transistor 70. The protective layer and/or planarizing layer may be formed of a single layer or multiple layers. In addition, the protective layer and/or planarizing layer may be formed of a variety of materials, including organic materials, inorganic materials, and organic/inorganic compounds.

An organic emission layer 72 of an EL device 71 is formed on the protective layer and/or the planarizing layer along a pixel define layer 74.

The EL device 71 emits, for example, red, green and blue beams to thus display a predetermined image. The EL device 71 includes a pixel electrode 73 connected to one of the source and drain electrodes 64a and 64b of the thin film transistor 70, a counter electrode 75 covering the overall pixel, and an organic emission layer 72 disposed between the pixel electrode 73 and the counter electrode 75 to emit light. However, the present embodiments are not limited to this configuration, and the embodiments can be applied to various types of organic light-emitting devices.

The organic emission layer 72 may be a low molecular weight layer or an organic polymer layer. In a case where the low molecular weight organic layer is used as the organic emission layer 72, various layers including a hole injection layer (HIL), a hole transport layer (HTL), an emission layer (EML), an electron transport layer (ETL), an electron injection layer (EIL), and the like, may be stacked in a single or complex structure. Various organic materials are useful in forming the organic emission layer 72, including copper phthalocyanine (CuPc), N,N'-Di(naphthalene-1-yl)-N,N'-diphenyl-benzidine (NPB), tris-8-hydroxyquinoline aluminum (Alq3), and on the like. The low molecular weight organic layer can be formed, for example, by vacuum deposition.

In a case where the organic polymer layer is used as the organic emission layer 72, a structure consisting of a hole transport layer (HTL) and an emission layer (EML) may be generally employed. In this case, poly (3,4-ethylenedioxythiophene)(PEDOT) may be used as the hole transport layer and organic polymer materials such as polyphenylenevinylenes (PPV) or polyfluorenes may be used as the emission layer. The organic emission layer 72 may be formed by screen printing or ink-jet printing.

The organic layer is not limited to those defined above, and there are various exemplary organic layers that are useful in the present embodiments.

The pixel electrode 73 functions as an anode and the counter electrode 75 functions as a cathode. Of course, the polarities of the pixel electrode 73 and the counter electrode 75 may be reversed.

By contrast, in a liquid crystal display device, a lower alignment layer (not shown) covering the pixel electrode 73 can be formed to complete a lower substrate of the liquid crystal display device.

In such a manner, the thin film transistor according to the present. embodiments can be mounted not only on a display circuit with various sub-pixels, as shown in FIG. 6, but also on a non-display circuit such as a driver circuit (not shown).

The present embodiments will now be described by the following examples, but the embodiments are not limited thereto.

EXAMPLE 1

A substrate having a gate electrode made of Al, an insulating layer made of silicon oxide, and source and drain electrodes made of Au, was prepared.

Alq$_3$ was deposited only on a predetermined region on the insulating layer formed on the substrate, where the source and drain electrodes are not formed, to form a hole blocking layer.

An organic semiconductor layer was formed of pentacene to cover the hole blocking layer and the source and drain electrodes, thereby completing an organic thin film transistor according to the present embodiments.

COMPARATIVE EXAMPLE 1

A substrate having a gate electrode made of MoW, an insulating layer made of silicon oxide (SiO$_2$), and source and drain electrodes made of Au, was prepared.

An organic semiconductor layer was formed of pentacene to cover the source and drain electrodes, thereby completing an organic thin film transistor.

Capacitance versus voltage (CV) characteristics of thin film transistors prepared in Example 1 and Comparative Example 1 were evaluated.

The evaluation results showed that little hysteresis was observed in the thin film transistor prepared in Example 1 whereas a distinct hysteresis characteristic was observed in the thin film transistor prepared in Comparative Example 1.

As described above, since the thin film transistor according to the present embodiments is constructed such that a carrier blocking layer is disposed between an organic semiconductor layer and an insulating layer, electrons or holes injected into the organic semiconductor layer can be prevented from being trapped in the insulating layer, thereby overcoming a hysteresis characteristic problem. Therefore, an improved thin film transistor in view of electrical properties such as charge mobility and on-current properties can be attained. Use of the thin film transistor allows a reliable flat panel display device to be manufactured.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A thin film transistor comprising:
    a gate electrode;
    source and drain electrodes insulated from the gate electrode;
    a semiconductor layer insulated from the gate electrode and electrically connected to the source and drain electrodes;
    an insulating layer for insulating the gate electrode from the source and drain electrodes or the semiconductor layer; and
    a carrier blocking layer interposed between the semiconductor layer and the insulating layer;
    wherein the carrier blocking layer is a hole blocking layer;
    wherein the hole blocking layer comprises a material having a HOMO level greater than that of the organic semiconductor forming the semiconductor layer; and
    wherein the hole blocking layer is selected from the group consisting of Alq3 (tris(8-hydroxyquinoline)aluminum), F4-TCNQ (2,3,5,6-Tetrafluoro-7,7,8,8-tetracyano-p-quinodimethane), NTCDA (1,4,5,8-naphthalenetetracarboxylic acid dianhydride), PTCDA (3,4,9,10-perylenetetracarboxylic dianhydride), BCP (bathocuproine), CBP (4,4'-N,N'-dicarbazolyl-biphenyl), copper phthalocyanine (CuPc), and PTCBI (3,4,9,10-perylenetetracarboxylic bisbenzimidazole).

2. The thin film transistor of claim 1, wherein the semiconductor layer comprises a p-type organic semiconductor.

3. The thin film transistor of claim 1, wherein an organic acceptor layer is further provided between the semiconductor layer and the source and drain electrodes.

4. The thin film transistor of claim 3, wherein the organic acceptor layer includes an aromatic compound containing at least one electron-withdrawing group selected from the group consisting of —NO$_2$, —CN, —C(=O)—, —COO—, —C(=O)—O—C(=O)—, —CONH—, —SO—, —SO$_2$—, —C(=O)—C(=O)—, =N—, —F, —Cl—, —I, C$_{1-10}$ haloalkyl group and C$_{5-10}$ haloaryl group.

5. The thin film transistor of claim 3, wherein the organic acceptor layer includes at least one selected from the group consisting of 2,4,7-trinitrofluorenone, 4-nitroaniline, 2,4-dinitroaniline, 5-nitroanthranilonitrile, 2,4-dinitrodiphenylamine, 1,5-dinitronaphthalene, 4-nitrobiphenyl, 4-dimethylamino-4'-nitrostilbene, 1,4-dicyanobenzene, 9,10-dicyanoanthracene, 1,2,4,5-tetracyanobenzene, 3,5-dinitrobenzonitrile, 3,4,9,10-perylenetetracarboxylic dianhydride, N,N'-bis(di-t-butylphenyl)-3,4,9,10-perylenedicarboxyimide), tetrachlorophthalic anhydride, tetrachlorophthalonitrile, tetrafluoro-1,4-benzoquinone, naphthoquinone, anthraquinone, phenanthrenequinone, 1,10-phenanthroline-5,6-dione, phenazine, quinoxaline and 2,3,6,7-tetrachloroquinoxaline.

6. The thin film transistor of claim 1, wherein the semiconductor layer is at least one organic semiconductor selected from the group consisting of pentacene, tetracene, anthracene, naphthalene, alpha-6-thiophene, alpha-4-thiophene, perylene and derivatives thereof, rubrene and derivatives thereof, coronene and derivatives thereof, perylene tetracarboxylic diimide and derivatives thereof, perylenetetracarboxylic dianhydride and derivatives thereof, polythiopene and derivatives thereof, polyparaphenylenevinylene and derivatives thereof, polyparaphenylene and derivatives thereof, polyfluorene and derivatives thereof, polythiophene vinylene and derivatives thereof, thiophene-heterocyclic aromatic copolymer and derivatives thereof, oligonaphthalene and derivatives thereof, oligothiopenes of alpha-5-thiophene and derivatives thereof, metal-containing phthalocyanine and derivatives thereof, metal-free phthalocyanine and derivatives thereof, pyromellitic dianhydride and derivatives thereof, and pyromellitic diimide and derivatives thereof.

7. The thin film transistor of claim 1, wherein the semiconductor layer comprises pentacene.

8. A flat panel display device comprising the thin film transistor of claim 1, wherein the thin film transistor is provided in each pixel, and a pixel electrode is electrically connected to a source or drain electrode of the thin film transistor.

9. A method for preparing a thin film transistor comprising:
    forming a gate insulating layer covering a gate electrode provided on a substrate;
    forming source electrodes and drain electrodes at predetermined locations corresponding to opposite ends of the gate electrode on the insulating layer;
    forming a carrier blocking layer on a predetermined region on the insulating layer; and
    forming a semiconductor layer on the resultant product that contacts the insulating layer through the carrier blocking layer;
    wherein the carrier blocking layer is a hole blocking layer;

wherein the hole blocking layer includes a material having a HOMO level that is at least about 0.5 eV greater than that of the organic semiconductor forming the semiconductor layer; and wherein the hole blocking layer is selected from the group consisting of Alq3 (tris(8-hydroxyquinoline)aluminum), F4-TCNQ (2,3,5,6-Tetrafluoro-7,7,8,8-tetracyano-p-quinodimethane), NTCDA (1,4,5,8-naphthalenetetracarboxylic acid dianhydride), PTCDA (3,4,9,10-perylenetetracarboxylic dianhydride), BCP (bathocuproine), CBP (4,4'-N,N'-dicarbazolyl-biphenyl), copper phthalocyanine (CuPc), and PTCBI (3,4,9,10-perylenetetracarboxylic bisbenzimidazole).

10. The method of claim 9, wherein the carrier blocking layer is formed by vacuum deposition.

11. A method for preparing a thin film transistor comprising:

forming a gate insulating layer covering a gate electrode provided on a substrate;

forming source electrodes and drain electrodes at predetermined locations corresponding to opposite ends of the gate electrode on the insulating layer;

forming a carrier blocking layer on a predetermined region on the insulating layer;

forming an organic acceptor layer to cover the source and drain electrodes on the resultant product; and forming a semiconductor layer on the resultant product that contacts the insulating layer through the carrier blocking layer;

wherein the carrier blocking layer is a hole blocking layer; wherein the hole blocking layer includes a material having a HOMO level that is at least about 0.5 eV greater than that of the organic semiconductor forming the semiconductor layer; and wherein the hole blocking layer is selected from the group consisting of Alq3 (tris(8-hydroxyquinoline)aluminum), F4-TCNQ (2,3,5,6-Tetrafluoro-7,7,8,8-tetracyano-p-quinodimethane), NTCDA (1,4,5,8-naphthalenetetracarboxylic acid dianhydride), PTCDA (3,4,9,10-perylenetetracarboxylic dianhydride), BCP (bathocuproine), CBP (4,4'-N,N'-dicarbazolyl-biphenyl), copper phthalocyanine (CuPc), and PTCBI (3,4,9,10-perylenetetracarboxylic bisbenzimidazole).

12. The method of claim 11, wherein the carrier blocking layer is formed by vacuum deposition.

13. A method for preparing a thin film transistor comprising:

forming source electrodes and drain electrodes on a substrate;

forming a semiconductor layer over the source electrodes and drain electrodes provided on the substrate;

forming a carrier blocking layer on a predetermined region on the semiconductor layer, the predetermined region corresponding to the source and drain electrodes;

forming the insulating layer that covers the semiconductor layer and the carrier blocking layer and contacts the semiconductor layer through the carrier blocking layer; and forming a gate electrode on a predetermined region on the insulating layer, the predetermined region corresponding to the source and drain electrodes wherein the carrier blocking layer is a hole blocking layer; and wherein the hole blocking layer includes a material having a HOMO level that is at least about 0.5 eV greater than that of the organic semiconductor forming the semiconductor layer; and wherein the hole blocking layer is selected from the group consisting of Alq3 (tris(8-hydroxyquinoline)aluminum), F4-TCNQ (2,3,5,6-Tetrafluoro-7,7,8,8-tetracyano-p-quinodimethane), NTCDA (1,4,5,8-naphthalenetetracarboxylic acid dianhydride), PTCDA (3,4,9,10-perylenetetracarboxylic dianhydride), BCP (bathocuproine), CBP (4,4'-N,N'-dicarbazolyl-biphenyl), copper phthalocyanine (CuPc), and PTCBI (3,4,9,10-perylenetetracarboxylic bisbenzimidazole).

14. The method of claim 13, wherein the carrier blocking layer is formed by vacuum deposition.

* * * * *

UNITED STATES PATENT AND TRADEMARK OFFICE
CERTIFICATE OF CORRECTION

| | | |
|---|---|---|
| PATENT NO. | : 7,671,359 B2 | Page 1 of 1 |
| APPLICATION NO. | : 11/329865 | |
| DATED | : March 2, 2010 | |
| INVENTOR(S) | : Min-Chul Suh et al. | |

It is certified that error appears in the above-identified patent and that said Letters Patent is hereby corrected as shown below:

Column 1 at line 18, Change "this" to --thin--
Column 3 at line 32, Before "film" insert --thin--
Column 3 at line 42, After "except" insert --that--
Column 3 at line 61, Change "organic" to --inorganic--
Column 3 at lines 65-66, Change "poly (vinyl alcohol)," to --poly(vinyl alcohol),--
Column 4 at line 30, Change "polythiopene" to --polythiophene--
Column 4 at lines 35-36, Change "oligothiopenes" to --oligothiophenes--
Column 5 at line 14, Change "quinodimethane" to --quinodimethane),--
Column 5 at line 18, Change "peryleneetracarboxylic" to --perylenetetracarboxylic--
Column 6 at line 14, Change "naphthalene -based" to --naphthalene-based--
Column 8 at lines 43-44, Change "poly (3,4-ethylenedioxythiophene)(PEDOT)" to
--poly(3,4-ethylenedioxythiophene) (PEDOT)--
Column 12 at line 15, In Claim 13, change "forming the" to --forming an--
Column 12 at line 26, In Claim 13, change "of the" to --of an--

Signed and Sealed this

Eighth Day of February, 2011

David J. Kappos
*Director of the United States Patent and Trademark Office*